United States Patent
Pigott et al.

(10) Patent No.: US 9,552,890 B2
(45) Date of Patent: Jan. 24, 2017

(54) ANTIFUSE WITH BYPASS DIODE AND METHOD THEREOF

(71) Applicant: Freescale Semiconductor, Inc., Austin, TX (US)

(72) Inventors: John M. Pigott, Phoenix, AZ (US); Randall C. Gray, Tempe, AZ (US)

(73) Assignee: NXP USA, Inc., Austin, TX (US)

( * ) Notice: Subject to any disclaimer, the term of this patent is extended or adjusted under 35 U.S.C. 154(b) by 13 days.

(21) Appl. No.: 14/189,529

(22) Filed: Feb. 25, 2014

(65) Prior Publication Data

US 2015/0243365 A1 Aug. 27, 2015

(51) Int. Cl.
| | | |
|---|---|---|
| G11C 17/06 | (2006.01) | |
| H01L 23/525 | (2006.01) | |
| G11C 17/16 | (2006.01) | |
| H01L 27/112 | (2006.01) | |
| G11C 17/18 | (2006.01) | |

(52) U.S. Cl.
CPC .............. G11C 17/16 (2013.01); G11C 17/06 (2013.01); H01L 23/5252 (2013.01); H01L 27/11206 (2013.01); G11C 17/18 (2013.01); H01L 2924/0002 (2013.01)

(58) Field of Classification Search
CPC ......... G11C 17/16; G11C 17/18; G11C 17/06; H01L 23/5252; H01L 27/11206
See application file for complete search history.

(56) References Cited

U.S. PATENT DOCUMENTS

| 5,486,776 | A | 1/1996 | Chiang | |
|---|---|---|---|---|
| 6,333,667 | B2 | 12/2001 | Lee | |
| 7,157,782 | B1* | 1/2007 | Shih | H01L 27/0203 257/50 |
| 9,147,840 | B2* | 9/2015 | Knobloch | H01L 27/2463 |
| 2008/0007885 | A1* | 1/2008 | Mehrl | H05B 33/0821 361/104 |
| 2008/0017912 | A1 | 1/2008 | Kumar et al. | |
| 2008/0211415 | A1* | 9/2008 | Altamura | H05B 37/036 315/192 |
| 2012/0195091 | A1* | 8/2012 | Schmitt | G11C 17/16 365/96 |
| 2015/0382439 | A1* | 12/2015 | Altamura | H05B 39/041 445/27 |

OTHER PUBLICATIONS

Ng et al., "Diode Based Gate Oxide Anti-fuse One Time Programmable Memory Array in Standard CMOS Process," IEEE, pp. 457-460, 2009 (4 pages).
He et al., "A Compact CMOS Compatible Oxide Antifuse With Polysilicon Diode Driver," IEEE Transactions on Electron Devices, vol. 59, No. 9, pp. 2539-2541, Sep. 2012 (3 pages).

* cited by examiner

Primary Examiner — Latanya N Crawford

(57) ABSTRACT

The embodiments described herein provide antifuse devices and methods that can be utilized in a wide variety of semiconductor devices. In one embodiment a semiconductor device is provided that includes an antifuse, a first diode coupled with the antifuse in a parallel combination, and a second diode coupled in series with the parallel combination. In such an embodiment the first diode effectively provides a bypass current path that can reduce the voltage across the antifuse when other antifuses are being programmed. As such, these embodiments can provide improved ability to tolerate programming voltages without damage or impairment of reliability.

19 Claims, 4 Drawing Sheets

US 9,552,890 B2

ANTIFUSE WITH BYPASS DIODE AND METHOD THEREOF

TECHNICAL FIELD

Embodiments described herein generally relate to semiconductor integrated circuit technology, and more particularly to antifuse element structures, and a method of manufacturing antifuse elements in semiconductor devices.

BACKGROUND

One-time programmable (OTP) elements such as fuses and antifuses have been used in a variety of semiconductor applications. For example, arrays of OTP elements have been used in read only memories (ROMs) for circuit trimming and other uses. When fuse elements are utilized, the device is programmed by blowing fusible links at selected nodes to create open circuits. When antifuse elements are utilized, the device is programmed by creating a short circuit or a low resistance path in a previously open circuit.

A typical antifuse element includes an insulating dielectric layer, such as a gate oxide, between two conducting layers. The un-programmed state of an antifuse element is an open circuit with intact dielectric. Programming an antifuse creates a shorting path at a damaged point, known as the rupture point, in the dielectric formed by applying a voltage and/or current higher than the dielectric rupture voltage and/or current.

In a typical application each antifuse is arranged in an antifuse bitcell, with each antifuse bitcell being accessible with row and column drivers. When so implemented, a large array of antifuses can be used to provide ROM and other similar devices.

One issue with such antifuse arrays is the application of voltage needed to program each antifuse. Specifically, as noted above a typical antifuse can require the application of a significant programming voltage to program each antifuse. When arranged in an array of rows and columns, the application of a voltage to program one antifuse can apply a corresponding negative voltage to other antifuses that are not intended to be programmed. In such cases, the antifuse bitcells in the array need to reliably tolerate the negative voltage without damage or impairment of reliability.

There thus remains a continuing need to improve the reliability of antifuses and in particular the reliability of antifuse bitcells to tolerate the application of negative voltages without damage to the antifuse or impairment of the reliability of the antifuse.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

The embodiments described herein provide antifuse devices and methods that can be utilized in a wide variety of semiconductor devices. In one embodiment a semiconductor device is provided that includes an antifuse, a first diode coupled with the antifuse in a parallel combination, and a second diode coupled in series with the parallel combination. In such an embodiment the first diode effectively provides a bypass current path that can reduce the voltage across the antifuse when other antifuses are being programmed. As such, these embodiments can provide improved ability to tolerate programming voltages without damage or impairment of reliability. For example, these embodiments can provide improved ability to tolerate the negative voltages that can be applied across an antifuse when other antifuses are being programmed.

As described above, a typical antifuse can require the application of a significant programming voltage to program the antifuse, i.e., to create a short circuit or a low resistance path in a previously open circuit. When arranged in an array with rows and columns, the application of a voltage to program one antifuse can apply a corresponding negative voltage to other antifuses' bitcells that are not selected or intended to be programmed by way of leakage currents in the selector diode. In such cases, embodiments described herein can reduce the voltage across the unselected antifuse when other antifuses in the array are being programmed. As such, these embodiments can provide improved ability of the array of antifuses to tolerate the programming of selected antifuses in the array.

Figure 1A:
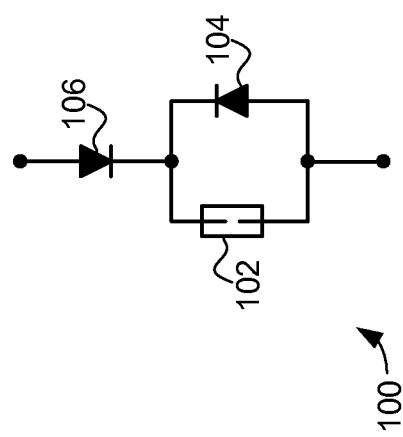
FIGS. 1A and 1B are schematic views of antifuse bitcells in accordance with an example embodiment.
Figure 1B:
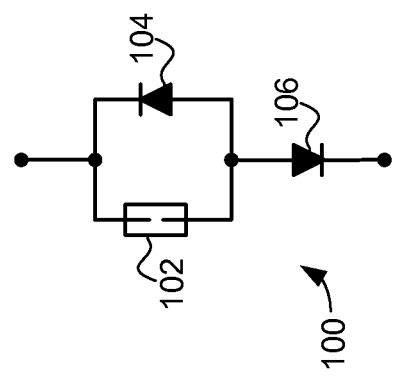

Turning now to FIGS. 1A and 1B, first and second embodiments of an antifuse bitcell 100 are illustrated. Referring to both embodiments together, the antifuse bitcell 100 comprises an antifuse 102, a first diode 104, and a second diode 106. The first diode 104 is coupled with the antifuse 102 in a parallel combination, and the second diode 106 is coupled in series with the parallel combination of the antifuse 102 and the first diode 104. So configured the second diode 106 is forward biased during programming to allow the programming current to flow through the antifuse 102 and program the antifuse.

In general, the first diode 104 serves as a bypass diode through which a bypass current can flow and reduce the voltage across the antifuse 102 when other antifuses are being programmed and when small amounts of reverse bias leakage current flow in second diode 106. Specifically, the first diode 104 is forward biased when programming voltages are being applied to certain other antifuses in the array. This forward biasing of the first diode 104 allows current to flow toward the second diode 106. This can prevent excessive voltage from being built up across the antifuse 102 during the programming of these other antifuses. Instead, the voltage across the antifuse 102 during the programming of these other antifuses is limited to the forward biased voltage of the first diode 104, e.g., 0.6 volts in a typical implementation.

When programming the antifuse 102, the first diode 104 is reversed biased compared to the programming voltage across the antifuse 102. Stated another way, the first diode 104 is coupled in antiparallel with the antifuse 102. Because the first diode 104 is reversed biased, only a relatively small amount of leakage current will flow through the first diode 104 during the programming of the antifuse 102, with the vast majority of programming current flowing through the antifuse 102 to facilitate efficient programming.

The second diode 106 is coupled in series with the parallel combination of the antifuse 102 and the first diode 104, and functions as a selector diode. Specifically, the antifuse 102 has a first node and a second node, and the first diode 104 has a first diode anode and a first diode cathode. The first diode 104 is coupled with the antifuse 102 in parallel combination by the first diode cathode being coupled to the first node of the antifuse 102, and the first diode anode being coupled to the second node of the antifuse 102.

In the embodiment illustrated in FIG. 1A, the second diode 106 includes a second diode anode and a second diode cathode, and the second diode 106 is coupled in series with the parallel combination by the second diode cathode being coupled to the first node of the antifuse 102. In such an embodiment, the antifuse 102 can be programmed by providing a positive programming voltage to the second diode anode such that programming current flows from the second diode 106 to the antifuse 102.

In contrast, FIG. 1B illustrates an embodiment where the second diode 106 includes a second diode anode and a second diode cathode, and the second diode is coupled in series with the parallel combination by the second diode anode being coupled to the second node of the antifuse 102. In such an embodiment the antifuse 102 can be programmed by providing a positive programming voltage to the first node of the antifuse 102 such that programming current flows from the antifuse 102 to the second diode 106.

As described above, in both embodiments illustrated, the first diode 104 serves as a bypass diode through which a bypass current (caused by leakage currents in second diode 106) can flow and reduce the voltage across the antifuse 102 when other antifuses are being programmed. Specifically, when antifuse bitcells 100 are arranged in an array the application of a voltage to program one antifuse 102 in an antifuse bitcell 100 can apply a corresponding negative voltage to other antifuses 102 in other antifuse bitcells 100 that are not intended to be programmed. While the second diodes 106 in the antifuse bitcells 100 will be reverse biased by this negative voltage and thus prevent an immediate generation of a programming current across the antifuse 100, the negative voltage could still damage these antifuses 100.

Specifically, when the negative voltages are applied the second diodes 106 will necessarily allow a relatively low amount of leakage current to pass through. While this leakage current is relatively small, it can nevertheless eventually cause a relatively high voltage to build up across the antifuse 102. Such a relatively high negative voltage can damage the antifuse 102 and thus reduce the reliability of the antifuse bitcell 100.

The embodiments described herein can reduce the buildup of voltage across the antifuse 100 when others of the antifuses 100 are being programmed. Specifically, as the leakage current flows through the second diode 106 and the voltage across first diode 104 rises, eventually the first diode 104 will forward bias. This forward biasing of the first diode 104 will allow a bypass current to flow through the first diode 104, preventing the negative voltage from building up any further across the antifuse 100. Stated another way, the negative voltage applied across the antifuse 102 will be limited to that needed to forward bias the first diode 104.

Likewise, the first diode 104 can also allow transient capacitive current to flow thus preventing voltage caused by the transient capacitive current from building up across the antifuse 100. In general, because the second diode 106 has some inherent capacitance the flipping of voltage direction can cause the flow of current, called a transient capacitive current. This transient capacitive current can flow through the first diode 104, again preventing the buildup of excessive voltage across the antifuse 102.

Thus, in both cases excessive voltage that could otherwise damage the antifuse 102 will not build up across the antifuse 102. As such, these embodiments can provide improved ability of the antifuses in the antifuse bitcells 302 to tolerate the programming of other antifuses in the array 300 and to tolerate voltages generated by transient capacitive currents.

Because this bypass current flow through the first diode 104 is limited to the leakage current that can flow through the reversed biased second diode 106, the first diode 104 can be relatively small compared to the second diode 106. In a typical embodiment the first diode 104 can be made with a minimum feature size, while the second diode 106 will be much larger to pass the programming current through the antifuse 102. For example, the second diode 106 can be at least twice as large as the first diode 104. In some embodiments the second diode 106 can have 20 times the area as the first diode 104.

Figure 2:
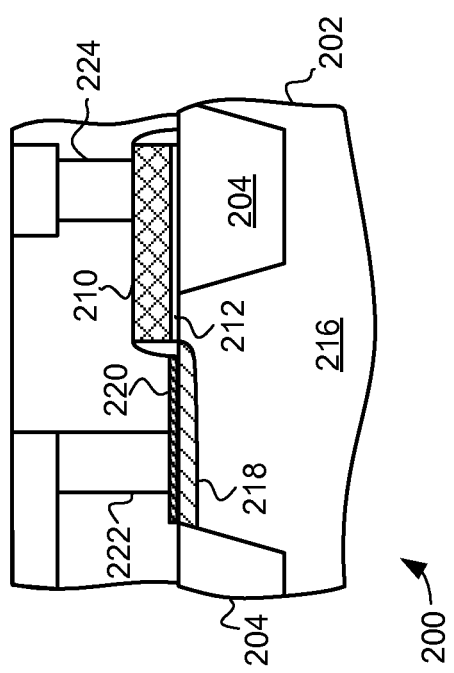
FIG. 2 is a cross sectional side view of an antifuse in accordance with an example embodiment.

Turning now to FIG. 2, a cross sectional side view of an antifuse 200 is illustrated. The antifuse 200 is exemplary of the type of antifuse that can be used in the embodiments described herein. In general, the antifuse 200 includes a substrate material 202 and isolation trenches 204 formed in the substrate material 202, with a bulk area 216 defined between the isolation trenches 204. A gate electrode 210 is positioned above the substrate material 202, and an insulating layer 212 is disposed between the gate electrode 210 and the substrate material 202. A diffusion region 218 is formed in the top of the bulk area 216. Silicide 220 is formed on top of the diffusion region 218. Contacts 222 and 224 are electrically coupled to the gate electrode 210 and the silicide 220 and can be used to apply a programming voltage or current to the antifuse 200.

So configured an open state initially exists between contacts 222 and 224. To program the antifuse 200 a programming voltage or current is applied to the contacts 222 and 224. This causes the current to flow along a current path between the gate electrode 210 and the contact 222. This current flow heats the area around the current path, which causes a rupture in the insulating layer 212 and creates a permanent short circuit between the contacts 222 and 224. Again, it should be noted that the antifuse 200 is just one example of the types of antifuse that can be used in the embodiments described herein.

Figure 3B:
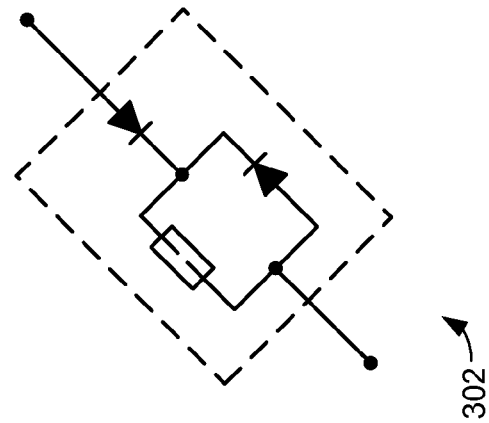
FIG. 3A is a schematic view of an array of antifuse bitcells, with FIG. 3B illustrating one exemplary antifuse bitcell in the array of antifuse bitcells in accordance with an example embodiment.
Figure 3A:
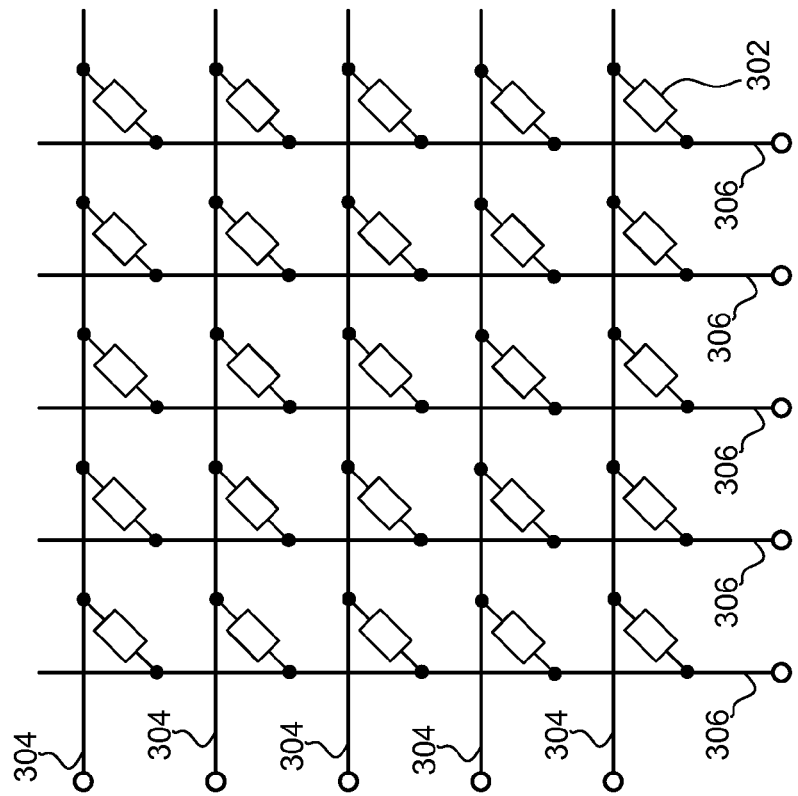

FIG. 3A illustrates a schematic view of an array of antifuse bitcells 300. FIG. 3B likewise illustrates one exemplary antifuse bitcell 302 in the array of bitcells 300. In this illustrated embodiment the array of antifuse bitcells 300 is a 5 by 5 array that includes 25 antifuse bitcells 302. Of course, this is just an example and it should be noted that many applications would include much larger arrays of antifuse bitcells 302.

In the illustrated example each antifuse bitcell 302 is coupled to a corresponding row line 304 and a corresponding column line 306. These row lines 304 and column lines 306 can be used to selectively provide programming voltages to individual antifuse bitcells 302 in the array 300. Furthermore, these row lines 304 and column lines 306 can be used to access the antifuse bitcells 302 after programming. For example, to read the antifuse bitcells 302 as a part of a read-only memory array.

As described above, the embodiments described herein can provide an improved ability to tolerate the negative voltages that can be applied across an antifuse when other antifuses are being programmed. Specifically, when antifuse bitcells 302 are arranged in an array as illustrated in FIG. 3, the application of a voltage to program one antifuse in an antifuse bitcell 302 can apply a similar, but negative voltage to other antifuses that are not intended to be programmed. While the second diodes in the antifuse bitcells 302 will be reverse biased by this negative voltage and thus prevent a large reverse programming current through the antifuse, the small negative current can still damage these antifuses.

Specifically, when these negative voltages are applied, the second diodes will necessarily allow a relatively low amount of leakage current to pass through. While this leakage current is relatively small, it can nevertheless eventually cause a relatively high voltage to build up across the antifuse. Such a relatively high negative voltage can damage the antifuse and thus reduce the reliability of the antifuses in the array 300.

The embodiments described herein can reduce the buildup of voltage across the antifuse when others of the antifuses in the array of antifuse bitcells 300 are being programmed. Specifically, as the leakage current flows in each bitcells' corresponding second diode and the negative voltage builds, eventually the corresponding first diode will forward bias. This forward biasing of the first diode will allow the leakage current to begin to flow through the first diode, preventing the negative voltage from building up any further across the antifuse. Stated another way, the negative voltage applied across the antifuse will be limited to that needed to forward bias the first diode. Thus, excessive voltage that could otherwise damage the antifuse will not build up across the antifuse. As such, these embodiments can provide improved ability of the antifuses in the antifuse bitcells 302 to tolerate the programming of other antifuses in the array 300.

Figure 4:
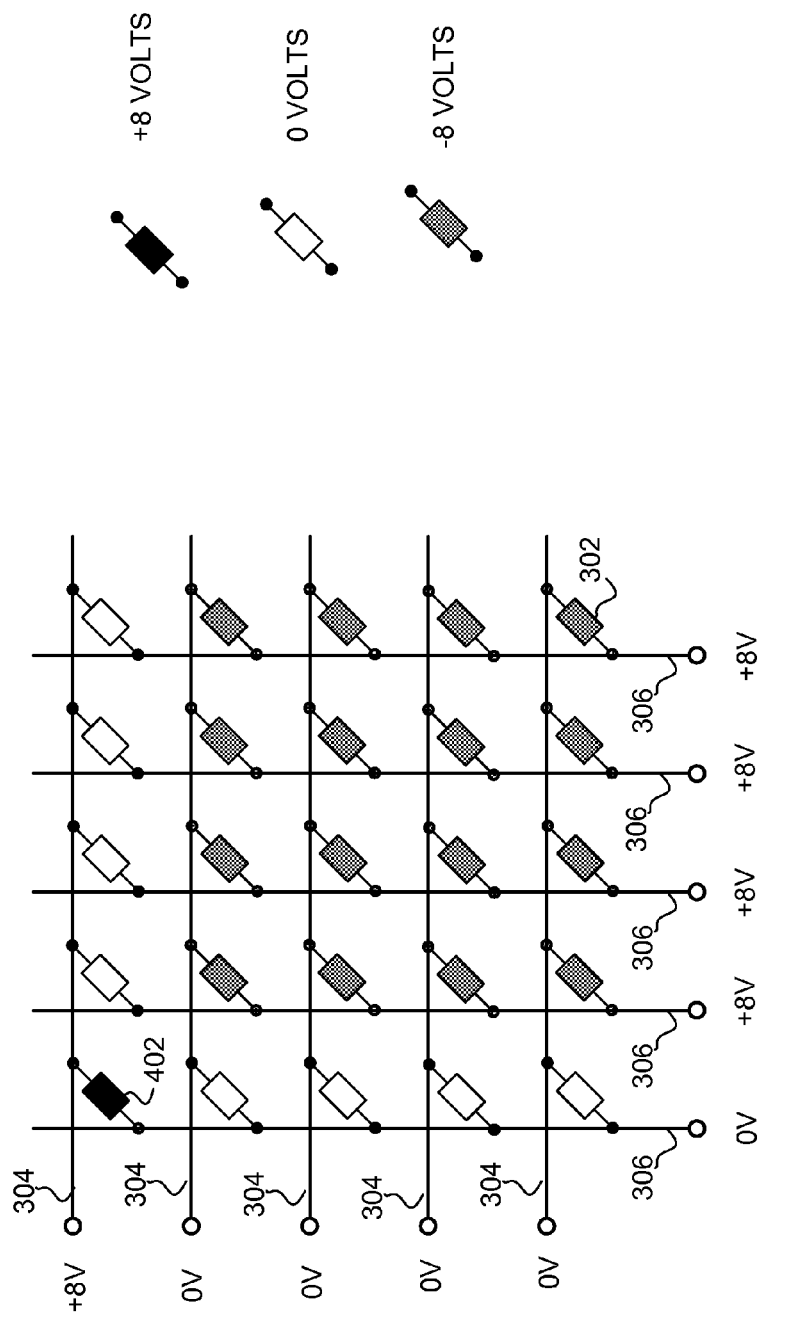
FIG. 4 is a schematic view of an array of antifuses during programming of a selected antifuse in accordance with an example embodiment.

As one specific example in a typical implementation the application of 8V can be used to program a selected antifuse bitcell 302 in an array of antifuses 300. In such a case negative 8V may be applied to some antifuse bitcells 302 that are not being programmed. Turning now to FIG. 4, the array of antifuse bitcells 300 is illustrated to show the exemplary voltages that could be applied when programming the antifuse bitcell 402 in the upper left corner of the array 300.

As illustrated in this example, the antifuse bitcell 402 can be programmed by applying 8V to the upper row line 304 and 0V to the left column line 306. The application of such a programming voltage applies positive 8V across the antifuse bitcell 402. This will forward bias the second diode in the antifuse bitcell 402, resulting in sufficient programming current to flow through the antifuse in the antifuse bitcell 402 to program the antifuse.

As also illustrated in the example of FIG. 4, during the programming of the antifuse bitcell 402 the remaining row lines 304 are biased with 0V, and the remaining column lines 306 are biased with 8V. This biasing ensures that no other antifuse bitcells 302 in the array 300 are biased with positive 8V and inadvertently programmed during the programming of the antifuse bitcell 402.

However, as illustrated in FIG. 4 this also results in some of the other antifuse bitcells 302 being biased with negative 8V. Specifically, those antifuse bitcells 302 that are in both different row lines 304 and different column lines 306 than the antifuse 402 will be biased with negative 8V. The negative 8V applied to each other antifuse bitcell 302 will reverse bias the second diodes in those antifuse bitcells 302.

Thus, the second diodes will prevent the negative 8V from immediately generating a programming current in those antifuse bitcells 302.

However, as was described above, because the second diodes will allow some leakage current to occur a voltage of negative 8V could eventually build up and be applied across the antifuse if not for the presence of the first diodes. Specifically, the first diodes will eventually be forward biased by the build-up of the negative voltage caused by the leakage currents. This forward biasing of the first diodes will allow current to flow and thus prevent further negative voltages from building up across the antifuse. Thus, the negative 8V will not be applied across the other antifuses and the likelihood of damage to those antifuses will be reduced.

The preceding detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or the detailed description.

The connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematics shown in the figures depict one exemplary arrangement of elements, additional intervening elements, devices, features, or components may be present in an embodiment of the depicted subject matter.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A semiconductor device comprising:
   an antifuse having a first node and a second node;
   a first diode having a first diode anode and a first diode cathode, the first diode cathode coupled to the first node of the antifuse, and the first diode anode coupled to the second node of the antifuse such that the first diode and the antifuse are in a parallel combination; and
   a second diode coupled in series with the parallel combination, where the second diode is coupled oppositely biased compared to the first diode, and where the first diode has a first area, and the second diode has a second area, and wherein the second area is at least twice as large as the first area.

2. The semiconductor device of claim 1 wherein the second diode includes a second diode anode and a second diode cathode, and wherein the second diode is coupled in series with the parallel combination by the second diode cathode being coupled to the first node of the antifuse.

3. The semiconductor device of claim 2 wherein the second diode anode is selectively coupled to a programming voltage source for programming the antifuse.

4. The semiconductor device of claim 1 wherein the second diode includes a second diode anode and a second diode cathode, and wherein the second diode is coupled in series with the parallel combination by the second diode anode being coupled to the second node of the antifuse.

5. The semiconductor device of claim 4 wherein the first node of the antifuse is selectively coupled to a programming voltage source for programming the antifuse.

6. The semiconductor device of claim 1 where the first diode has a first area, and the second diode as a second area, and wherein the second area is sufficient to carry a programming current, and wherein the first area is sufficient to carry a leakage current.

7. The semiconductor device of claim 1 wherein the antifuse comprises:
   a substrate material;
   a gate electrode positioned above the substrate material; and
   an insulating layer disposed between the gate electrode and the substrate material such that voltage applied between the gate electrode and the substrate material causes a rupture in the insulating layer and creates a current path through the insulating layer.

8. A semiconductor device, comprising:
   an array of antifuse bitcells, each antifuse bitcell comprising;
      an antifuse having a first node and a second node,
      a first diode having a first diode anode and a first diode cathode, the first diode cathode coupled to the first node of the antifuse, and the first diode anode coupled to the second node of the antifuse such that the first diode and the antifuse are in a parallel combination, and
      a second diode coupled in series with the parallel combination; and
   driver circuitry configure to selectively program the array of antifuse bitcells by selectively applying a programming voltage to a selected antifuse bitcell.

9. The semiconductor device of claim 8 wherein the second diode includes a second diode anode and a second diode cathode, and wherein the second diode is coupled in series with the parallel combination by the second diode cathode being coupled to the first node of the antifuse.

10. The semiconductor device of claim 9 wherein the driver circuitry is coupled to the second diode anode for selectively applying the programming voltage to the selected antifuse bitcell.

11. The semiconductor device of claim 8 wherein the second diode includes a second diode anode and a second diode cathode, and wherein the second diode is coupled in series with the parallel combination by the second diode anode being coupled to the second node of the antifuse.

12. The semiconductor device of claim 11 wherein the driver circuitry is coupled to the first node of the antifuse for selectively applying the programming voltage to the selected antifuse bitcell.

13. The semiconductor device of claim 8 where the first diode has a first area, and the second diode as a second area, and wherein the first area is at least twice as large as the second area.

14. The semiconductor device of claim 8 wherein the semiconductor device is formed in a substrate material, and wherein each antifuse in the array of antifuse bitcells comprises:
   a gate electrode positioned above the substrate material; and
   an insulating layer disposed between the gate electrode and the substrate material such that voltage applied between the gate electrode and the substrate material causes a rupture in the insulating layer and creates a current path through the insulating layer.

15. A semiconductor device comprising:
   an antifuse having a first node and a second node;
   a first diode having a first diode anode and a first diode cathode, the first diode cathode coupled to the first node of the antifuse, and the first diode anode coupled to the second node of the antifuse such that the first diode and the antifuse are in a parallel combination; and
   a second diode coupled in series with the parallel combination, where the first diode has a first area, and the second diode has a second area, and wherein the second area is at least twice as large as the first area.

16. The semiconductor device of claim 15 wherein the second diode includes a second diode anode and a second diode cathode, and wherein the second diode is coupled in series with the parallel combination by the second diode cathode being coupled to the first node of the antifuse, wherein the second diode anode is selectively coupled to a programming voltage source for programming the antifuse.

17. The semiconductor device of claim 15 wherein the second diode includes a second diode anode and a second diode cathode, and wherein the second diode is coupled in series with the parallel combination by the second diode anode being coupled to the second node of the antifuse, wherein the first node of the antifuse is selectively coupled to a programming voltage source for programming the antifuse.

18. The semiconductor device of claim 15 where the second area is sufficient to carry a programming current, and wherein the first area is sufficient to carry a leakage current.

19. The semiconductor device of claim 15 wherein the antifuse comprises:
   a substrate material;
   a gate electrode positioned above the substrate material; and
   an insulating layer disposed between the gate electrode and the substrate material such that voltage applied between the gate electrode and the substrate material causes a rupture in the insulating layer and creates a current path through the insulating layer.

* * * * *